(12) United States Patent
Zhang et al.

(10) Patent No.: US 11,735,679 B2
(45) Date of Patent: Aug. 22, 2023

(54) WAVEGUIDE TYPE PHOTODETECTOR AND METHOD OF MANUFACTURE THEREOF

(71) Applicant: ROCKLEY PHOTONICS LIMITED, Altrincham (GB)

(72) Inventors: Yi Zhang, Pasadena, CA (US); Hooman Abediasl, Pasadena, CA (US); Aaron John Zilkie, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 0 days.

(21) Appl. No.: 17/059,088

(22) PCT Filed: May 29, 2019

(86) PCT No.: PCT/IB2019/000669
§ 371 (c)(1),
(2) Date: Nov. 25, 2020

(87) PCT Pub. No.: WO2019/229532
PCT Pub. Date: Dec. 5, 2019

(65) Prior Publication Data
US 2021/0234058 A1    Jul. 29, 2021

Related U.S. Application Data

(60) Provisional application No. 62/678,003, filed on May 30, 2018.

(51) Int. Cl.
*H01L 31/101*    (2006.01)
*H01L 31/0232*   (2014.01)
(Continued)

(52) U.S. Cl.
CPC ........ *H01L 31/1013* (2013.01); *H01L 31/028* (2013.01); *H01L 31/02327* (2013.01); *H01L 31/1804* (2013.01); *H01L 31/105* (2013.01)

(58) Field of Classification Search
CPC ............. H01L 31/02327; H01L 31/028; H01L 31/09–119; H01L 31/1804; G02F 1/025
See application file for complete search history.

(56) References Cited

U.S. PATENT DOCUMENTS 7,603,016 B1    10/2009  Soref
2014/0061677 A1*  3/2014  Jakoby ............... G01N 21/648
                                               257/E33.077
(Continued)

OTHER PUBLICATIONS

Dong et al., "Ge0.9Sn0.1 multiple-quantum-well p-i-n photodiodes for optical communications at 2 μm", 2017 Optical Fiber Communications Conference and Exhibition (OFC), Date of Conference: Mar. 19-23, 2017, Date Added to IEEE Xplore: Jun. 1, 2017 (Year: 2017).*

(Continued)

*Primary Examiner* — Andres Munoz
(74) *Attorney, Agent, or Firm* — Lewis Roca Rothgerber Christie LLP

(57) ABSTRACT

A silicon based photodetector and method of manufacturing the same are provided. The photodetector comprising: a silicon substrate; a buried oxide layer, above the silicon substrate; and a waveguide, above the buried oxide layer. The waveguide includes a silicon, Si, containing region and a germanium tin, GeSn, containing region, both located between a first doped region and a second doped region of the waveguide, thereby forming a PIN diode. The first doped region and the second doped region are respectively connected to first and second electrodes, such that the waveguide is operable as a photodetector.

22 Claims, 4 Drawing Sheets

(51) Int. Cl.
   *H01L 31/028* (2006.01)
   *H01L 31/18* (2006.01)
   *H01L 31/105* (2006.01)

(56) References Cited

U.S. PATENT DOCUMENTS

2015/0016769 A1  1/2015  Verma et al.
2018/0101082 A1  4/2018  Yu et al.

OTHER PUBLICATIONS

U.K. Intellectual Property Office Examination Report, dated Nov. 29, 2021, for Patent Application No. GB 2019942.8, 4 pages.
Chen, H. T. et al., "High-Responsivity Low-Voltage 28-Gb/s Ge p-i-n Photodetector With Silicon Contacts", Journal of Lightwave Technology, Feb. 15, 2015, pp. 820-824, vol. 33, No. 4, IEEE.
International Search Report and Written Opinion of the International Searching Authority, dated Nov. 7, 2019, Corresponding to PCT/IB2019/000669, 13 pages.
Lischke, S. et al., "High bandwidth, high responsivity waveguide-coupled germanium p-i-n photodiode", Optics Express, Oct. 8, 2015, pp. 27213-27220, vol. 23, No. 21, Optical Society of America.
Oehme, M. et al., "GeSn p-i-n detectors integrated on Si with up to 4% Sn", Applied Physics Letters, 2012, pp. 141110-1 through 141110-4, vol. 101, No. 14, American Institute of Physics.
Pham, T. et al., "Systematic study of Si-based GeSn photodiodes with 2.6 μm detector cutoff for short-wave infrared detection", Optics Express, Feb. 23, 2016, pp. 4519-4531, vol. 24, No. 5, Optical Society of America.
Xu, S. et al., "$Ge_{0.9}Sn_{0.1}$ p-i-n photodiode with record-high responsivity at two-micron-wavelength", 2018, pp. 139-140, IEEE.
Zhang, Y. et al., "A high-responsivity photodetector absent metal-germanium direct contact", Optics Express, pp. 11367-11375, vol. 22, No. 9, Optical Society of America.

* cited by examiner

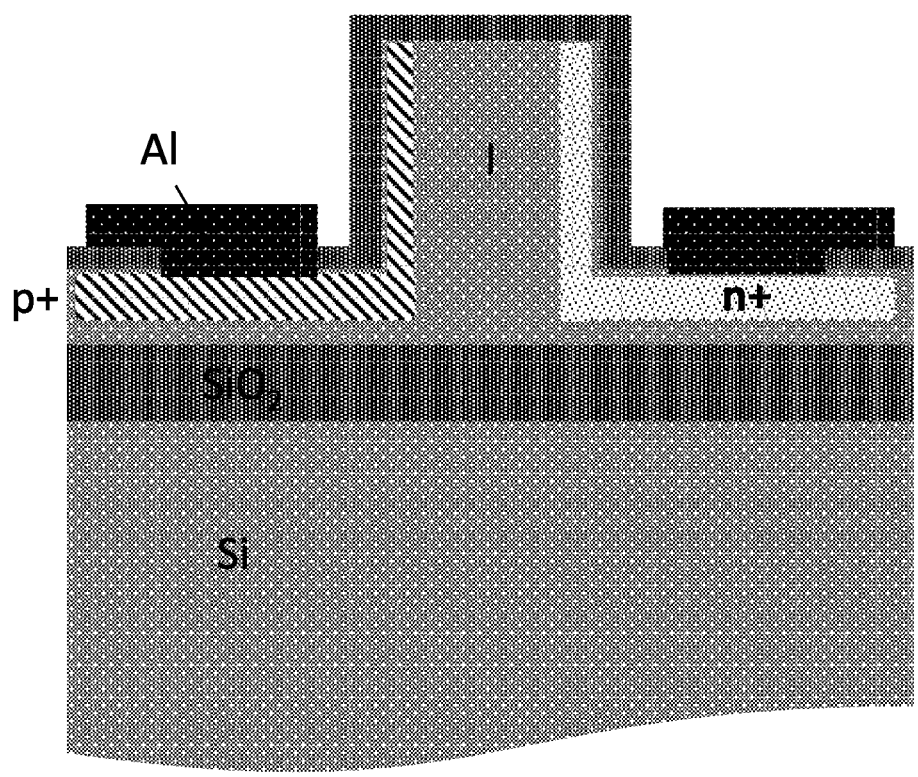
Fig. 1  Conventional Photodetector
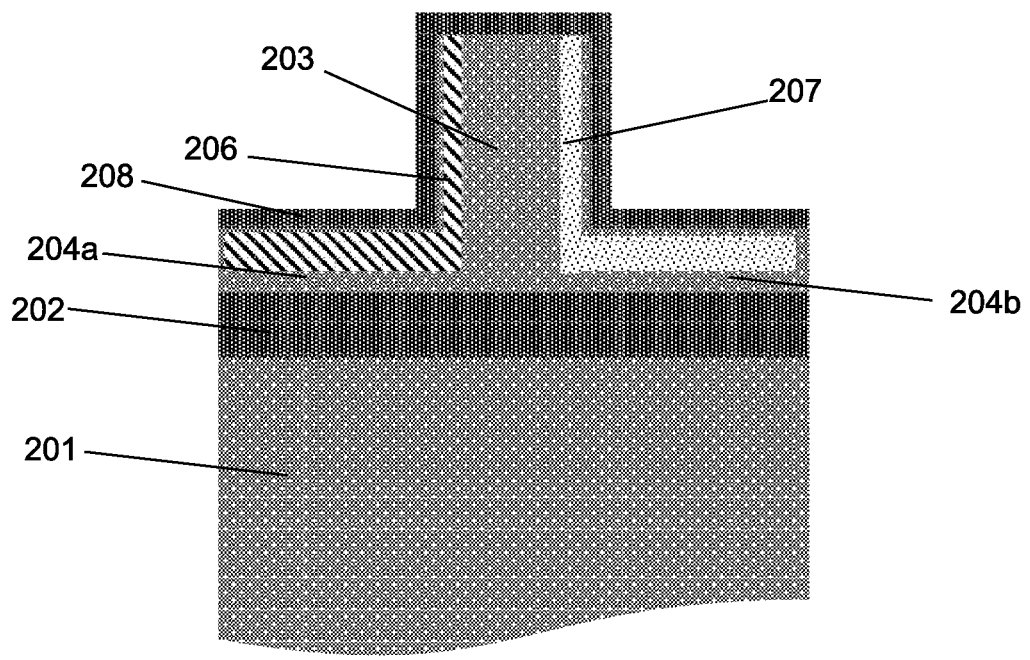
Fig. 2A

WAVEGUIDE TYPE PHOTODETECTOR AND METHOD OF MANUFACTURE THEREOF

CROSS-REFERENCE TO RELATED APPLICATION(S)

This application is a national stage entry, under 35 U.S.C. § 371, of International Application Number PCT/IB2019/000669, filed on May 29, 2019, which claims priority to and the benefit of U.S. Provisional Patent Application No. 62/678,003, filed May 30, 2018. The entire contents of all of the applications identified in this paragraph are incorporated herein by reference.

FIELD OF THE INVENTION

The present invention relates to a silicon based photodetector, and a method of manufacturing a silicon based photodetector.

BACKGROUND

Photodetectors are ubiquitous in the context of photonic platforms and networks. Conventionally, germanium based silicon photodetectors have been used as the light absorbing material within the photodetector. However, germanium based detectors only work up to a bandgap wavelength of around 1.55 µm. Whereas there are increasing silicon photonic applications at wavelengths beyond 1.55 µm.

Moreover, it is convenient to integrate photodetectors or photodiodes within a photonic circuit (as opposing to bonding them to a part of the circuit). A bonded photodiode incurs coupling losses, and the bonding has a cost in terms of manufacturing (and also in terms of the yield of that process). Further, bonding a photodiode places a restriction on the number of the devices that can be used in a photonic integrated circuit and where they can be placed. In contrast, an integrated photodetector incurs essentially no coupling loss, and has a high responsivity.

FIG. 1 shows a conventional silicon photodetector using a PIN junction. A p doped region and an n doped region extend up the sidewalls of a waveguide ridge, and an intrinsic region is located therebetween. Light passing through the junction is captured by the photodetector, and a signal is provided.

SUMMARY

Accordingly, in a first aspect, embodiments of the present invention provide a silicon based photodetector, comprising:
a silicon substrate;
a buried oxide layer, above the silicon substrate; and
a waveguide, above the buried oxide layer;
wherein the waveguide includes a silicon, Si, containing region and a germanium tin, GeSn, containing region, both located between a first doped region and a second doped region of the waveguide, thereby forming a PIN diode;
and wherein the first doped region and the second doped region are respectively connected to first and second electrodes, such that the waveguide is operable as a photodetector.

Such a photodetector can be integrated in a silicon photonic platform, for example in a photonic integrated circuit (PIC) and has a detectable wavelength beyond 1.55 µm. For example, GeSn as a material has a bandgap wavelength of between around 2 µm and around 3 µm.

The silicon based photodetector may have any one or, to the extent that they are compatible, any combination of the following optional features.

The waveguide may be a rib or ridge waveguide, located between a first slab portion and a second slab portion. The first doped region and the second doped region may be located within respective sidewalls of the rib waveguide. The first doped region and the second doped region may respectively extend into the first slab portion and the second slab portion. The first electrode and the second electrode may respectively contact the first doped region and the second doped region in portions of the first doped region and the second doped region which are within the respective slab portions.

The photodetector may have an operating wavelength of at least 1.3 µm. The photodetector may have an operating wavelength of at least 1.55 µm. The photodetector may have an operating wavelength of no more than 3.5 µm.

The germanium tin containing region may be formed of $Ge_{0.93}Sn_{0.07}$.

The germanium tin containing region may be formed of $Ge_{0.90}Sn_{0.10}$.

A width of the germanium tin containing region, as measured in a direction perpendicular to the guiding direction of the waveguide and parallel to a surface of the substrate, may be at least 40% and more than 60% of a width, measured in the same direction, of the waveguide region.

The germanium tin containing region may be positioned in the waveguide at a point distal to the buried oxide layer.

The waveguide may have a height, as measured from a surface of the buried oxide layer adjacent the waveguide to a surface of the waveguide distalmost from the buried oxide layer, of at least 2.5 µm and no more than 3.5 µm.

The waveguide may have a width, as measured from a first side and a second side of the waveguide which are equidistant from the buried oxide layer, of at least 1.5 µm and no more than 2.5 µm.

The first slab portion and the second slab portion may have a height, as measured from an uppermost surface of the buried oxide layer to a surface of the respective slab portions distalmost from the buried oxide layer, of at least 0.2 µm and no more than 0.6 µm.

The germanium tin containing region may be formed of essentially pure germanium tin.

The germanium tin containing region may contain no silicon.

In a second aspect, embodiments of the invention provide a method of manufacturing a silicon based photodetector, comprising the steps of:
providing a silicon based substrate, a buried oxide layer above the silicon substrate, and a waveguide above the buried oxide layer;
doping a first region with dopants of a first species to form a first doped region;
doping a second region with dopants of a second species to form a second doped region;
etching at least a portion of the waveguide, between the first doped region and the second doped region, to provide a cavity therein; and
depositing germanium tin into the cavity, to provide a germanium tin containing region of the waveguide adjacent to a silicon containing region of the waveguide.

The method may have any one or, to the extent that they are compatible, any combination of the following optional features.

Depositing the germanium tin may be performed through selective epitaxial growth.

The method may further comprise a step of passivating the device by depositing a passivating layer over an uppermost surface thereof.

The method may include a step of depositing a first electrode and a second electrode, respectively in contact with the first doped region and the second doped region.

BRIEF DESCRIPTION OF THE DRAWINGS

Embodiments of the invention will now be described by way of example with reference to the accompanying drawings in which:

FIG. 1 shows a cross-sectional view of a conventional photodetector;

FIGS. 2A-2E show various manufacturing steps of an embodiment of the present invention.

DETAILED DESCRIPTION AND FURTHER OPTIONAL FEATURES

Figure 2B:
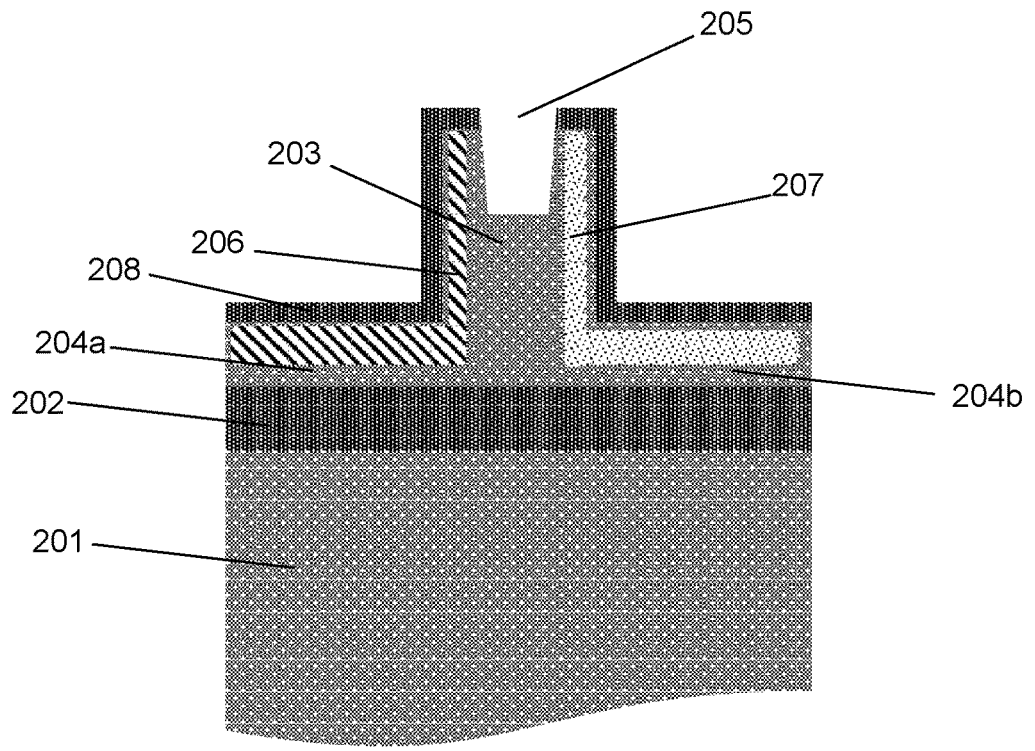

Aspects and embodiments of the present invention will now be discussed with reference to the accompanying figures. Further aspects and embodiments will be apparent to those skilled in the art. All documents mentioned in this text are incorporated herein by reference FIG. 2A to 2E show various manufacturing steps of an embodiment of the present invention. In an initial step shown in FIG. 2A, a silicon substrate 201 is provided, with a buried oxide layer 202 above the silicon substrate, and a waveguide 203 above the buried oxide layer. The waveguide 203 guides light in a direction into or out of the plane of FIG. 2A. First 206 and second 207 doped regions are then provided in respective slab portions 204a and 204b. The slab and waveguide regions are formed in the device or silicon-on-insulator layer of an SOI wafer from which the device is fabricated. The upper surfaces of the structure are covered in a passivation or passivating layer 208, which may be silicon dioxide.

The structure may be substantially the same as that shown in FIG. 1, asides from the exclusion of the electrodes. This step may be a front end of line (FEOL) processing step.

Figure 2C:
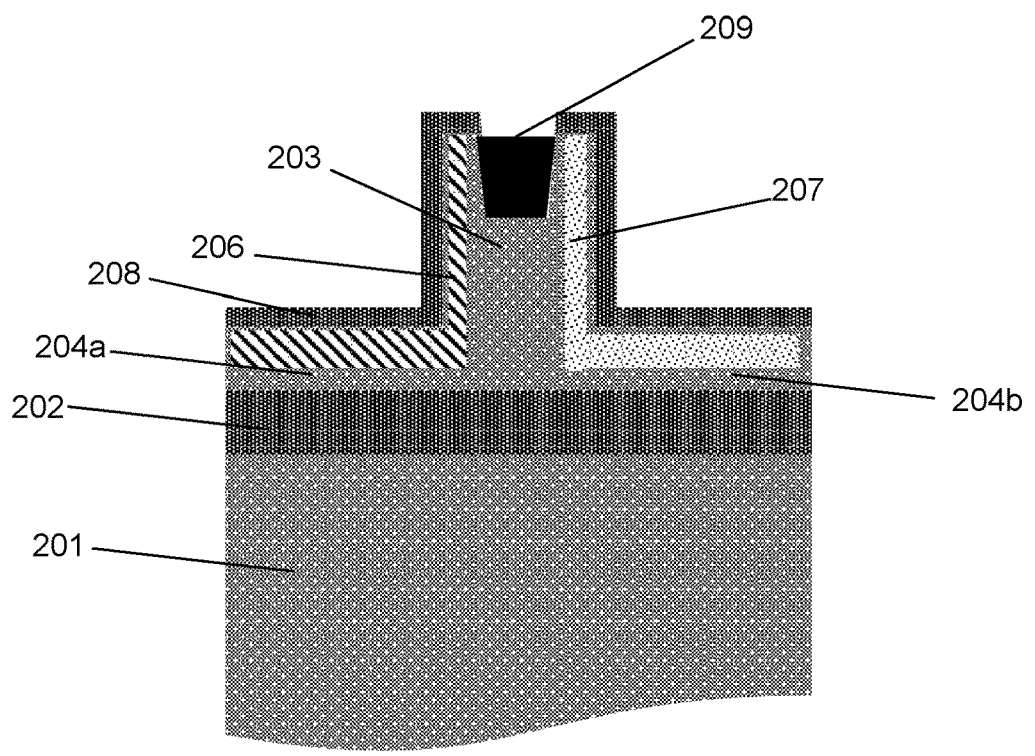
Figure 2D:
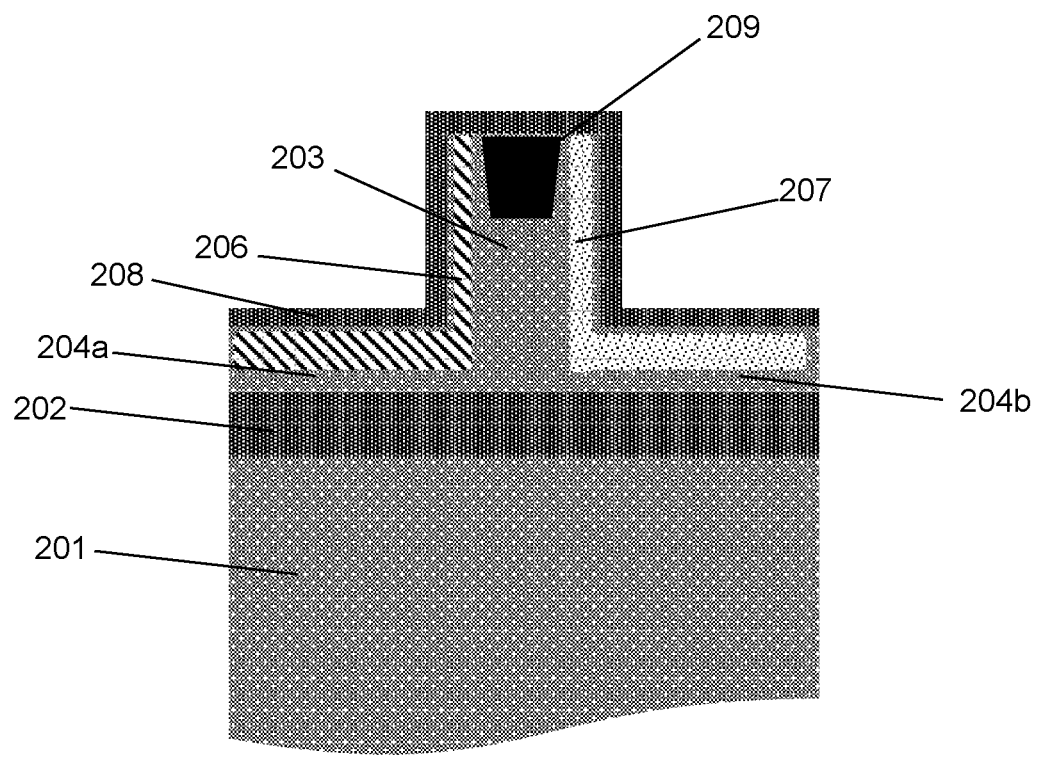

Next, an etch is performed to remove a portion of the waveguide. The result of this is shown in FIG. 2B, where cavity 205 is can be seen in an upper portion of the waveguide 203. The cavity is, in this example, trapezoid in shape. After the etch, a selective epitaxial process is used to grow a germanium tin (GeSn) region 209 within the cavity. This is shown in FIG. 2C. After the epitaxial growth process has been performed, a passivation process is undertaken so as to provide a contiguous passivating or passivation layer 208 across the upper surface of the device. This is shown in FIG. 2D.

Figure 2E:
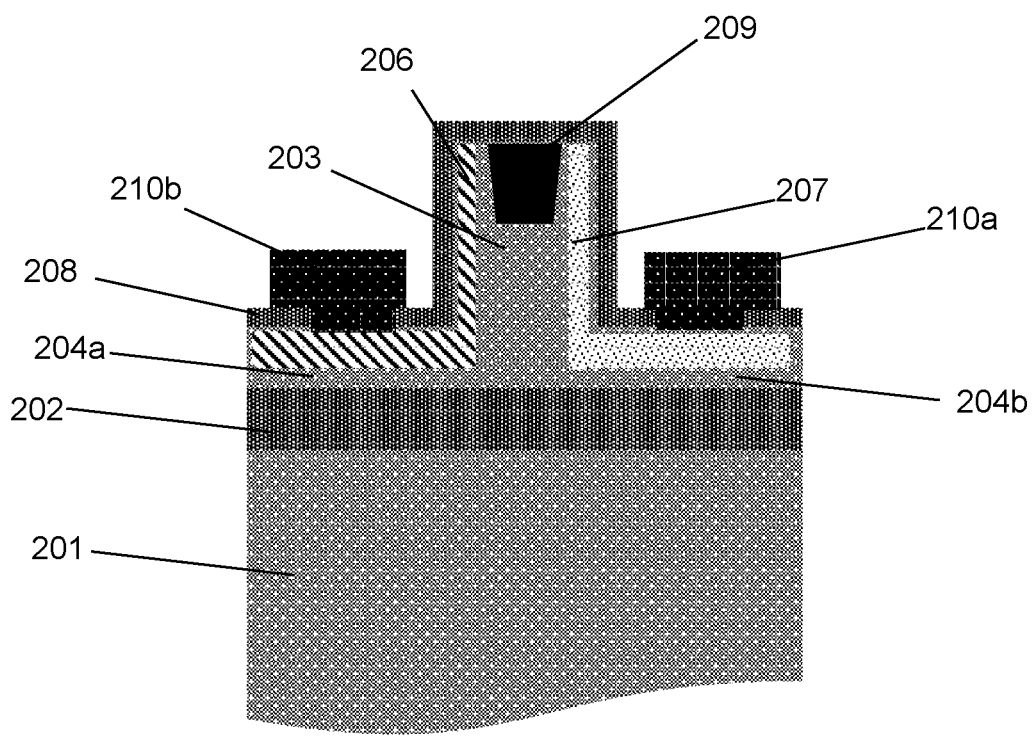

Finally, as shown in FIG. 2E, first 210a and second 210b electrodes are provided which respectively contact the first 206 and second 207 doped regions. This step may be performed in two sub-steps: a first step of etching vias through the passivation layer 208 which exposes uppermost surfaces of the first and second doped regions. Subsequently, a metallization process is used to provide electrical contacts to these exposed surfaces of the doped regions as well as provide electrode pads for connecting to external connectors. The steps shown in FIGS. 2C-2E may be back end of line (BEOL) process steps.

Figure 3:
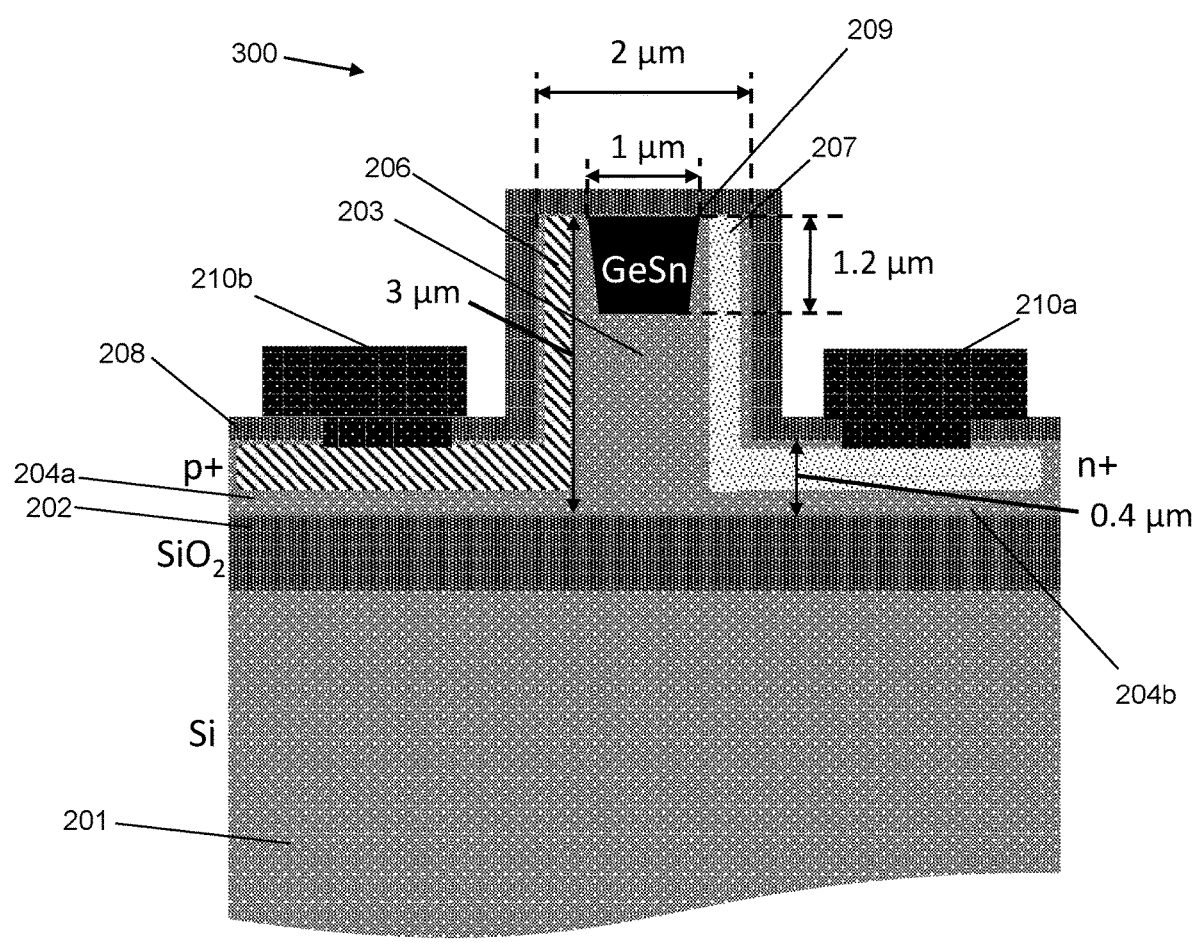
FIG. 3 shows a cross-sectional view of a photodetector according to an embodiment of the present invention.

The steps 2A-2E result in a device 300 according to embodiments of the present invention as shown in FIG. 3. The substrate 201 is formed from silicon, and the buried oxide layer 202 is formed from silicon dioxide ($SiO_2$). The waveguide 203, slab portions 204 a, 204 b, and doped regions 206 and 207 are all formed from silicon. The germanium tin containing region 209 is formed of germanium tin, having relatively low levels of tin. For example, the germanium tin containing region may have the composition $Ge_{0.90}Sn_{0.10}$ or $Ge_{0.93}Sn_{0.07}$.

The germanium tin containing region 209 has a maximum width (measured in a direction perpendicular to the guiding direction of the waveguide, and to a height direction extending from the substrate 201 to the waveguide 203) of around 1 µm. The germanium tin containing region has a height, as measured perpendicular to the width, of around 1.2 µm. The waveguide 203 itself, formed chiefly of silicon, has a width of around 2 µm and a height, as measured from an uppermost surface of the buried oxide layer to an uppermost surface of the waveguide, of around 3 µm. The slab regions 204a and 204b have a height, as measured from an uppermost surface of the buried oxide layer to an uppermost surface of the slab region(s) of around 0.4 µm. The electrodes are formed from aluminium.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

The invention claimed is:

1. A silicon based photodetector, comprising:
a silicon substrate;
a buried oxide layer, above the silicon substrate; and
a rib waveguide, above the buried oxide layer and adjacent to a slab portion, the slab portion being above the buried oxide layer,
wherein the rib waveguide includes a silicon (Si) containing region and a germanium tin (GeSn) containing region, both located between a first doped region and a second doped region of the rib waveguide, thereby forming a PIN diode, wherein a portion of the silicon containing region overlapping the germanium tin containing region in a plan view protrudes above the slab portion in a direction away from the buried oxide layer, and
wherein the first doped region and the second doped region are respectively connected to first and second electrodes, such that the rib waveguide is operable as a photodetector.

2. The silicon based photodetector of claim 1, wherein the slab portion includes a first slab portion and a second slab portion, and the rib waveguide is located between the first slab portion and the second slab portion.

3. The silicon based photodetector of claim 2, wherein the first doped region and second doped region are located within respective sidewalls of the rib waveguide.

4. The silicon based photodetector of claim 3, wherein the first doped region and second doped region respectively extend into the first slab portion and second slab portion.

5. The silicon based photodetector of claim 4, wherein the first electrode and second electrode respectively contact the first doped region and second doped region in portions of the first doped region and second doped region which are within the respective slab portions.

6. The silicon based photodetector of claim 2, wherein the first slab portion and the second slab portion have a height, as measured from an uppermost surface of the buried oxide layer to a surface of the respective slab portions distalmost from the buried oxide layer, of at least 0.2 μm and no more than 0.6 μm.

7. The silicon based photodetector of claim 1, having an operating wavelength of at least 1.3 μm.

8. The silicon based photodetector of claim 1, having an operating wavelength of at least 1.55 μm.

9. The silicon based photodetector of claim 1, having an operating wavelength of no more than 3.5 μm.

10. The silicon based photodetector of claim 1, wherein the germanium tin containing region is formed of $Ge_{0.93}Sn_{0.07}$.

11. The silicon based photodetector of claim 1, wherein the germanium tin containing region is formed of $Ge_{0.90}Sn_{0.10}$.

12. The silicon based photodetector of claim 1, wherein a width of the germanium tin containing region, as measured in a direction perpendicular to a guiding direction of the rib waveguide and parallel to a surface of the silicon substrate, is at least 40% and no more than 60% of a width, as measured in the same direction, of the rib waveguide.

13. The silicon based photodetector of claim 1, wherein the germanium tin containing region is positioned in the rib waveguide at a point distal to the buried oxide layer.

14. The silicon based photodetector of claim 1, wherein the rib waveguide has a height, as measured from a surface of the buried oxide layer adjacent the rib waveguide to a surface of the rib waveguide distalmost from the buried oxide layer, of at least 2.5 μm and no more than 3.5 μm.

15. The silicon based photodetector of claim 1, wherein the rib waveguide has a width, measured from a first side of the rib waveguide and a second side of the rib waveguide, which are equidistant from the buried oxide layer, of at least 1.5 μm and no more than 2.5 μm.

16. The silicon based photodetector of claim 1, wherein the germanium tin containing region is formed of essentially pure germanium tin.

17. The silicon based photodetector of claim 1, wherein the germanium tin containing region does not contain any silicon.

18. A method of manufacturing the silicon based photodetector of claim 1, the method comprising the steps of:
   providing the silicon substrate, the buried oxide layer above the silicon substrate, and the rib waveguide above the buried oxide layer;
   doping a first region with dopants of a first species to form the first doped region;
   doping a second region with dopants of a second species to form the second doped region;
   etching at least a portion of the rib waveguide, between the first doped region and the second doped region, to provide a cavity therein; and
   depositing germanium tin into the cavity, to provide the germanium tin containing region of the rib waveguide adjacent to the silicon containing region of the rib waveguide.

19. The method of claim 18, wherein depositing the germanium tin is performed through selective epitaxial growth.

20. The method of claim 18, further comprising a step of passivating the silicon based photodetector by depositing a passivating layer over an uppermost surface thereof.

21. The method of claim 18, further comprising a step of depositing the first electrode and the second electrode, respectively in contact with the first doped region and the second doped region.

22. The silicon based photodetector of claim 1,
   wherein the first doped region and the second doped region are located within respective sidewalls of the rib waveguide.

* * * * *